United States Patent [19]
Sartorius et al.

[11] Patent Number: 6,122,306
[45] Date of Patent: Sep. 19, 2000

[54] SELF-PULSING MULTI-SECTION LASER

[75] Inventors: Bernd Sartorius; Martin Moehrle; Uwe Feiste; Juergen Hoerer-Dragendorf, all of Berlin, Germany

[73] Assignee: Heinrich-Hertz-Institut fuer Nachrichtentechnik Berlin GmbH, Berlin, Germany

[21] Appl. No.: 08/930,356

[22] PCT Filed: Mar. 29, 1996

[86] PCT No.: PCT/DE96/00597

§ 371 Date: Sep. 30, 1997

§ 102(e) Date: Sep. 30, 1997

[87] PCT Pub. No.: WO96/30976

PCT Pub. Date: Oct. 3, 1996

[30] Foreign Application Priority Data

Mar. 31, 1995 [DE] Germany .................... 195 13 198

[51] Int. Cl.⁷ .................. H01S 3/08; H01S 3/085
[52] U.S. Cl. .................. 372/96; 372/45; 372/46; 372/50; 372/25; 372/20
[58] Field of Search .................. 372/96, 45, 46, 372/50, 25, 20

[56] References Cited

U.S. PATENT DOCUMENTS

| | | | |
|---|---|---|---|
| 4,852,108 | 7/1989 | Utaka et al. | 372/20 |
| 4,885,753 | 12/1989 | Okai et al. | 372/45 |
| 5,003,549 | 3/1991 | Mitsui et al. | 372/48 |
| 5,379,318 | 1/1995 | Weber | 372/96 |

FOREIGN PATENT DOCUMENTS

| | | |
|---|---|---|
| 0300790 | 1/1989 | European Pat. Off. . |
| 1-024483 | 1/1989 | Japan . |
| 8-031653 | 3/1996 | Japan . |
| 3884503 | 11/1993 | United Kingdom . |

OTHER PUBLICATIONS

IEEE Photonics Technology Letters.vol. 4, No. 9, Sep. 1, 1992, New York, pp.976–978.
IEEE Photonics Technology Letters. vol. 7, No. 3, Mar. 1995, New York, pp. 278–280.
Journal of Lightwave Technology, vol.10, No. 2, Feb 1, 1992, New York, pp. 199–205.
Patent Abstracts of Japan, vol. 011, No. 320, (E–550) Oct. 17, 1987.

Primary Examiner—Rodney Bovernick
Assistant Examiner—Sung T. Kim
Attorney, Agent, or Firm—Karl Hormann

[57] ABSTRACT

In a self-pulsing multi-section laser having two DFB sections, a Fabry-Perot-like resonator formed from two reflectors and a spacer is integrated into the multi-section laser and optically coupled to at least one DFB section. The spacer has a similar layer structure to the adjacent DFB sections ($D_1$ and $D_2$) but not DFB grid and takes the form of a control section operable electrically separated from the DFB sections. Selection is unnecessary. The self-pulsing two-section DFB laser of the invention with an integrated control section is suitable for optical beat regeneration in high-rate communication systems.

15 Claims, 4 Drawing Sheets

SELF-PULSING MULTI-SECTION LASER

BACKGROUND OF THE INVENTION

1. Field of the Invention

The invention relates to a self-pulsing multi-section laser provided with two DFB (distributed feedback) sections.

2. Prior Art

In recent years functional multi-section lasers have been developed for the regeneration of signals in ultra-fast optical telecommunication networks, for attaining, purely optically, higher operating velocities with simplified and more compact signal processing modules, while at the same time avoiding opto-electrical conversions.

In accordance with the state of the art, low-frequency self-pulsations in semiconductor lasers may be generated by bleaching out an absorber, e.g. in three section DFB (distributed feedback) lasers (ELECTRONICS LETTERS, Nov. 10, 1988, Vol. 24, No. 23, pp. 1426–1427) or in two section Fabry-Perot (FP) lasers (IEEE Photonics Technology Letters, Vol. 3, No. 10, October 1991, pp. 942–945). The physical limit of velocity is directly related to the lifetime of the charge carrier in the absorber section. By utilizing absorptive effects, the self-pulsating frequencies are, therefore, limited to several hundred MHZ up to several GHz. Furthermore, in order to achieve any self-pulsation at all, the lifetime of the charge carrier in the absorber must be less than that in the pump section, which requires special technological treatment of the absorber section.

Higher self-pulsation frequencies have been realized by utilizing dispersive effects in two-section DFB lasers in which the configuration of the individual sections does not require any additional effort.

The state of the art, from which the invention is proceeding, relates to a multi-section DFB laser provided with two DFB sections, and has been described in IEEE Photonics Technology Letters, Vol. 4, No. 9, September 1992, pp. 976 to 978. The two optically coupled DFB sections of the multi-section laser have identical layer structures, and in their longitudinal direction they are electrically separated by an etch moat. The structure of a fin wave guide is provided with quarternary active layers of a wave length of the 1.55 $\mu$m band gap. The first order DFB gratings were holographically fabricated and transferred to the upper layer of the wave guide by a wet etching process. The facets of the two DFB sections were not coated. For generating self-pulsations in this two section DFB laser, certain critical spectral correlations of laser modes are required in the two DFB sections. These may be attained by the setting of certain combinations of currents in the two sections.

With the described two-section DFB laser, pulsation frequencies were attained which were higher by an order of magnitude than in the above mentioned lasers incorporating absorbers. In this arrangement, the pulsation frequency can be tuned entirely electrically by continuous adjustment of the operating currents in the two sections over a wide frequency range. The results of continuing work have been reported in Proc. of 14th IEEE Intern. Semicond. Laser Conf., Sep. 19–23, 1994, pp. 227–228. An optimization of the DFB laser structure was carried out by structuring its active layer as a multi quantum well and by realizing a greater coupling coefficient of the DFB grating. In a two-section DFB laser optimized in this manner, it was possible continuously to the tune the pulsation frequency between 12 and 64 GHz, by changing the operating current of only one DFB section, while maintaining the operating current of the other section constant.

The results presented thus far cannot, however, be reproduced at random. It is known that the phase position of the light reflected at a facet has a significant effect upon the spectral characteristic of a DFB laser, relative to the DFB grating. With facets produced by cleavage the resultant phase position of each DFB laser is an individual and technologically uncontrollable factor. Since to date high frequency self-pulsations have been demonstrated only experimentally with DFB lasers having at least one unbloomed facet, it has thus far been necessary to select components for attaining lasers of suitable pulsation characteristics. Even nominally identical lasers fabricated directly adjacent each other on a chip displayed very great differences as regards the generation and characteristics (e.g. frequency) of the self-pulsations.

OBJECT OF THE INVENTION

It is, therefore, a primary object of the invention to provide a self-pulsing, multi-section laser in which a reproducible defined adjustment of high-frequency self-pulsations is possible without any selection.

BRIEF SUMMARY OF THE INVENTION

In accordance with the invention, the task is accomplished by integrating into a self-pulsing multi-section laser of the kind referred to supra a Fabry-Perot-like resonator constructed from two reflectors and a spacer and by optically coupling it to at least one DFB section, and by the spacer being provided with a layer structure which is similar to the adjacent DBF section, except that it has no DFB grating and being structured as a control section operable in electrical separation from the DFB sections.

By integrating the additional section which together either with the two adjacent DFB sections acting as a reflector, or with an adjacent DFB section and an unbloomed facet, forms a Fabry-Perot (FP)-like resonator, the oscillating laser modes must conform to the DFB mode conditions as well as the FP mode conditions. DFB laser modes which do not conform to the mode condition of the FP resonator are thus very effectively extracted. If the operating currents of the two DFB sections are adjusted appropriately for self-pulsation, the mode appropriate for self-pulsation can be selectively enhanced or suppressed, and the self-pulsation may thus be switched on or off. By way of the electrical energization of the spacer formed as a control section, separated from the two DFB sections, the index of refraction in this section may be selectively altered by injecting current. In this manner, the optical resonator length and the spectral position of the FP modes may be electrically adjusted, and the additional section without the DFB grating operates as a control section. Thus, for the first time a mode-selective and electrically tunable optical resonator has been realized as a self-pulsing multi-section laser.

With given constant currents in the DFB sections, the laser wave length may additionally be finely tuned by way of the control current. In this manner, a fine adjustment of the pulsation conditions is possible, for instance for an optimum frequency stability. The optimization may be performed in a variable manner, i.e. anew for each operating point. The pulsation frequency may thus be tuned over a wide range by the DFB currents, under optimum pulsation conditions, because the changes in mode correlations resulting form (unavoidable) heating effects can be compensated by adjusting the control current.

Compared to the layer structure of the DFB sections, no elaborate technological steps are necessary for fabricating a multi-section laser in accordance with the invention; that is to say, the two section DFB laser with an electrically tunable control section may be realized with about the same technological effort as has hitherto be required in connection with "pure" two-section DFB lasers. A selection of suitable DFB laser structures of the kind hitherto required is avoided, since with suitable operating currents in the DFB sections, the pulsation is simply switched on by the current in the control section. In this manner, those operating conditions for optimum pulsation which heretofore existed accidentally and uncontrollably, may selectively be electrically adjusted in the multi-section laser.

In one embodiment of the invention the spacer is formed as a passive control section and is not provided with any active layer. In an advantageous embodiment, the passive control section may be arranged between a facet limiting the multi-section laser and a DFB section. In this case, the facet is unbloomed so that the self pulsation of the multi-section laser is switchable and optimizable by way of the adjustable phase conditions in the FP resonator. The other facet may be bloomed.

In another advantageous embodiment, the spacer formed as a passive control section is arranged between the two DFB sections. Both facets which limit the multi section laser may be bloomed in this embodiment. In this manner, integration into optical control circuits is possible.

In the mentioned embodiments it is primarily the refractive index of the control section which is altered by the current applied to this section, with otherwise constant operating currents of the two DFB sections.

In a further embodiment of the invention the spacer is structured as an active control section. It is provided with a similar active layer as the adjacent DFB sections and is arranged between the two DFB sections. In this embodiment, the attenuation or amplification of the light wave is controlled by the current with only a weak effect on the refractive index.

Where—as provided in another embodiment—the spacer is formed from an active as well as a passive control section and is arranged between the two DFB sections, refractive index and amplification or attenuation may be separately controlled. The optical coupling of the DFB sections may in this case be altered by the active control section, and the pulsation frequency may be tuned over a broader range.

In order selectively to adjust the critical mode correlation which in normal circumstances results from different heating caused by different currents flowing through the two DFB sections, the gratings in the two DFB sections in a further embodiment are detuned relative to each other in the Bragg wave length. In this manner it is possible with smaller currents to attain an intended detuning or substantially greater detuning may be realized, as the case may be.

In accordance with another embodiment of the invention, the separate optimization of the two DFB sections as regards their different functions, such as, for example, as light emitters and as spectrally selective light reflector, is made possible by the structure of the grating. Thus, in this embodiment, the gratings in the two DFB sections have differently valued coupling coefficients.

BRIEF SUMMARY OF THE SEVERAL DRAWINGS

Further expedient embodiments of the invention will hereinafter be described in detail in connection with the description of the preferred embodiments of the invention, with reference to the drawing.

FIG. 1 schematically depicts the schematic structure of a multi-section laser consisting of two DBF sections and a passive control section arranged between a facet limiting the multi-section laser and a DFB section;

DETAILED DESCRIPTION OF PREFERRED EMBODIMENTS

Figure 1:
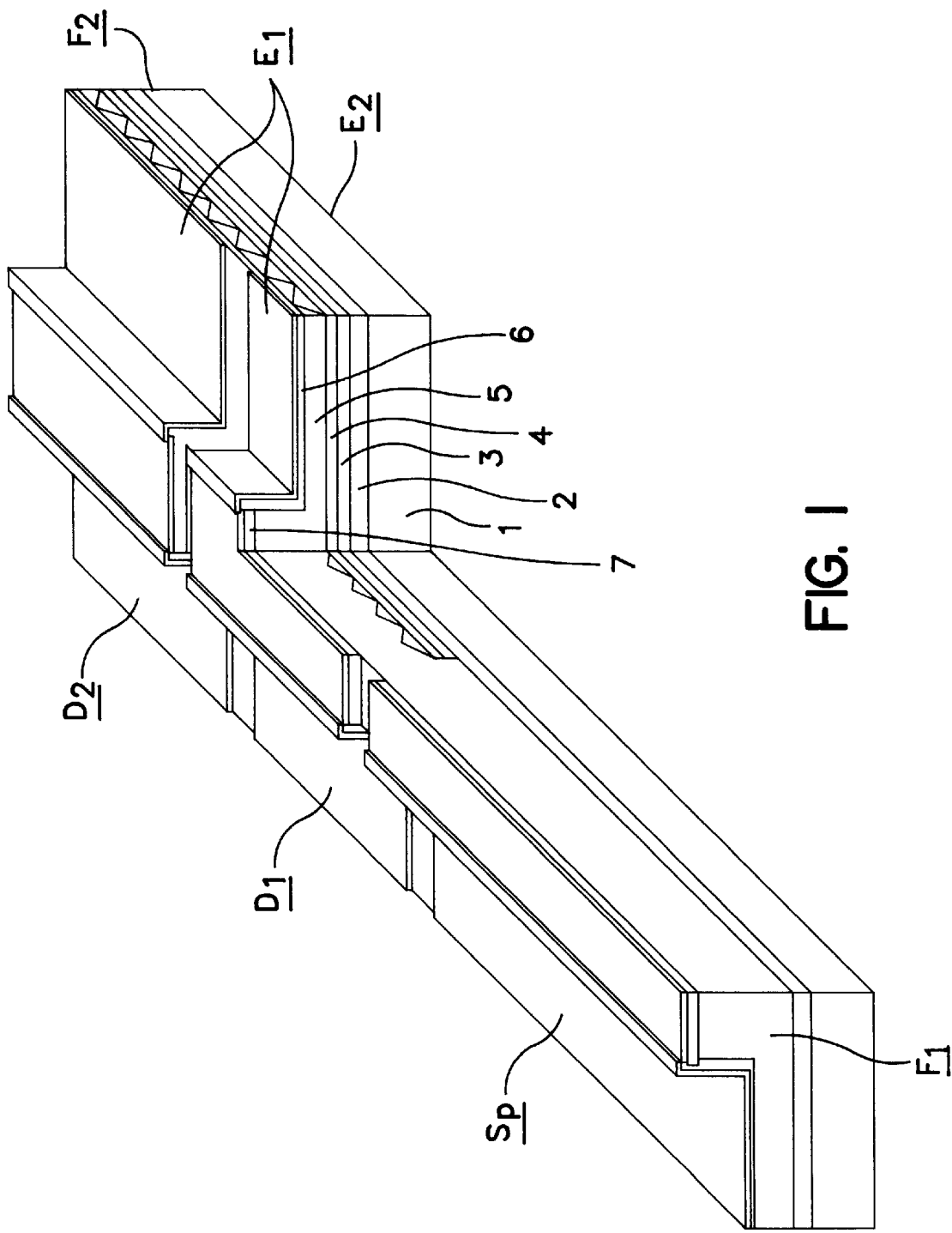

FIG. 1 schematically depicts the structure of a multi-section laser of a fin wave guide type consisting of two DFB sections $D_1$ and $D_2$ and a spacer of an FP-like resonator. The resonator is formed as a passive control section $S_p$ and is arranged between an unbloomed facet $F_1$ which limits the multi-section laser and the DFB section $D_1$. On an n-InP substrate 1, between a 300 nm n-1.3 $\mu$m InGaAsP waveguide layer 2 and a 150 nm p-1.18 $\mu$m InGaAsP wave-guide layer 4 there is arranged a 1.55 $\mu$m layer of InGaAsP as an active layer 3 of a thickness of 150 nm. A DFB grating was inscribed by electron beam lithography and etched into the p-waveguide 4. A p-InP layer 5 and an insulating $SiN_x$ layer 6 open only at the fin and covered by an electrode layer $E_1$ are positioned thereon. The center strip of the finned wave guide structure is additionally provided with a 400 nm thick p-InGaAs layer 7 for reducing any contact resistance. The length of each of the two DFB sections $D_1$ and $D_2$ is 200 $\mu$m; the passive control section $S_p$ has a length of 400 $\mu$m. The DFB section $D_2$ is limited by an antireflection-coated facet $F_2$. The substrate 1 is positioned on a base electrode $E_2$. The individual sections are separately energized by direct current. Current injected in the passive control section $S_p$ results in a change of the refractive index. In this manner, the optical resonator length and the spectral position of the FP modes may be adjusted electrically. In order to reduce the technological complexity during fabrication of the layer structure no p-waveguide layer 4 was provided in the passive control section $S_p$. This has no effect on the principle of the solution in accordance with the invention.

Figure 2:
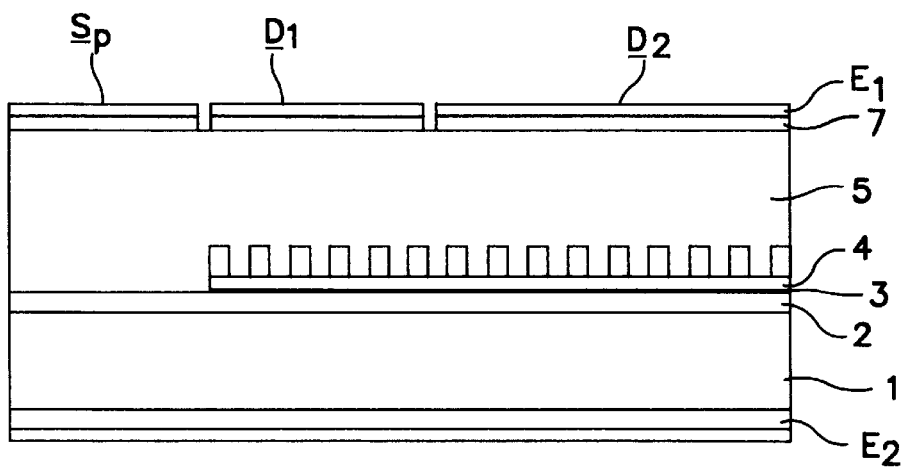
FIG. 2 is a cross-section of the multi-section laser depicted in FIG. 1.

The same described multi-section laser is shown in cross-section in FIG. 2. In the longitudinal direction the section goes through the raised center strip of the fin waveguide structure and clearly shows the similar layer structure of the passive control section $S_p$ and the two DFB sections $D_1$ and $D_2$. The layer structure is provided with the following layers: a base electrode $E_2$, an n-InP substrate 1, an n-InGaAsP waveguide layer 2, an active InGaAsP layer 3, a p-InGaAs waveguide layer 4 provided with a DFB grating, a p-InP layer 5, a p-InGaAs layer 7, and a cover electrode $E_1$ electrically separated by sections.

Figure 3:
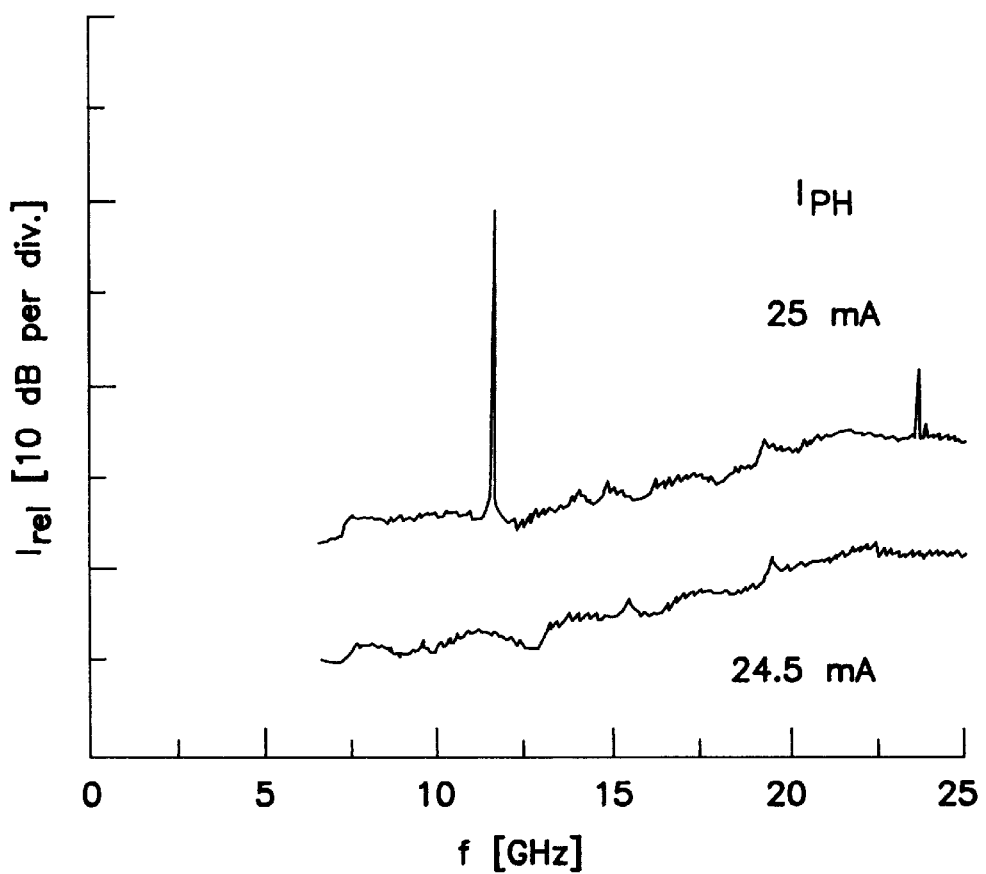
FIG. 3 represents the switching on of the self-pulsation by phase current in a multi-section laser shown in FIG. 1.

Switching of the self-pulsation of the multi-section laser in accordance with the invention is clearly shown in FIG. 3. It shows the relative intensity $I_{rel}$ of output modulations as a function of their frequency f at different currents $I_{PH}$ in the control section $S_p$ which change the phase position of the reflected light beam or the FP mode conditions, as the case may be. Switching on of the self-pulsation was adjusted to values at which the multi-section laser displays a mono-mode-emission and at which initiation of the self-pulsation may be expected. The DFB section $D_2$ was operated as a reflector at 8 mA, and the section $D_1$ at 140 mA as laser section. The current $I_{PH}$ was under these conditions varied in the control section $S_p$, in order to attain self-pulsation. It was found that at critical phase currents $I_{PH}$ a small change only in this parameter is decisive for a drastic change of the spectrum. The lower spectrum at $I_{PH}$=24.5 mA corresponds to a laser having constant emission; when the phase current $I_{PH}$ was raised to 25 mA initiation of self-pulsation could unequivocally be demonstrated. It thus becomes clear that self-pulsation in the multi-section laser in accordance with the invention may be switched on and off simply by tuning of the phase conditions in the passive control section.

Figure 4:
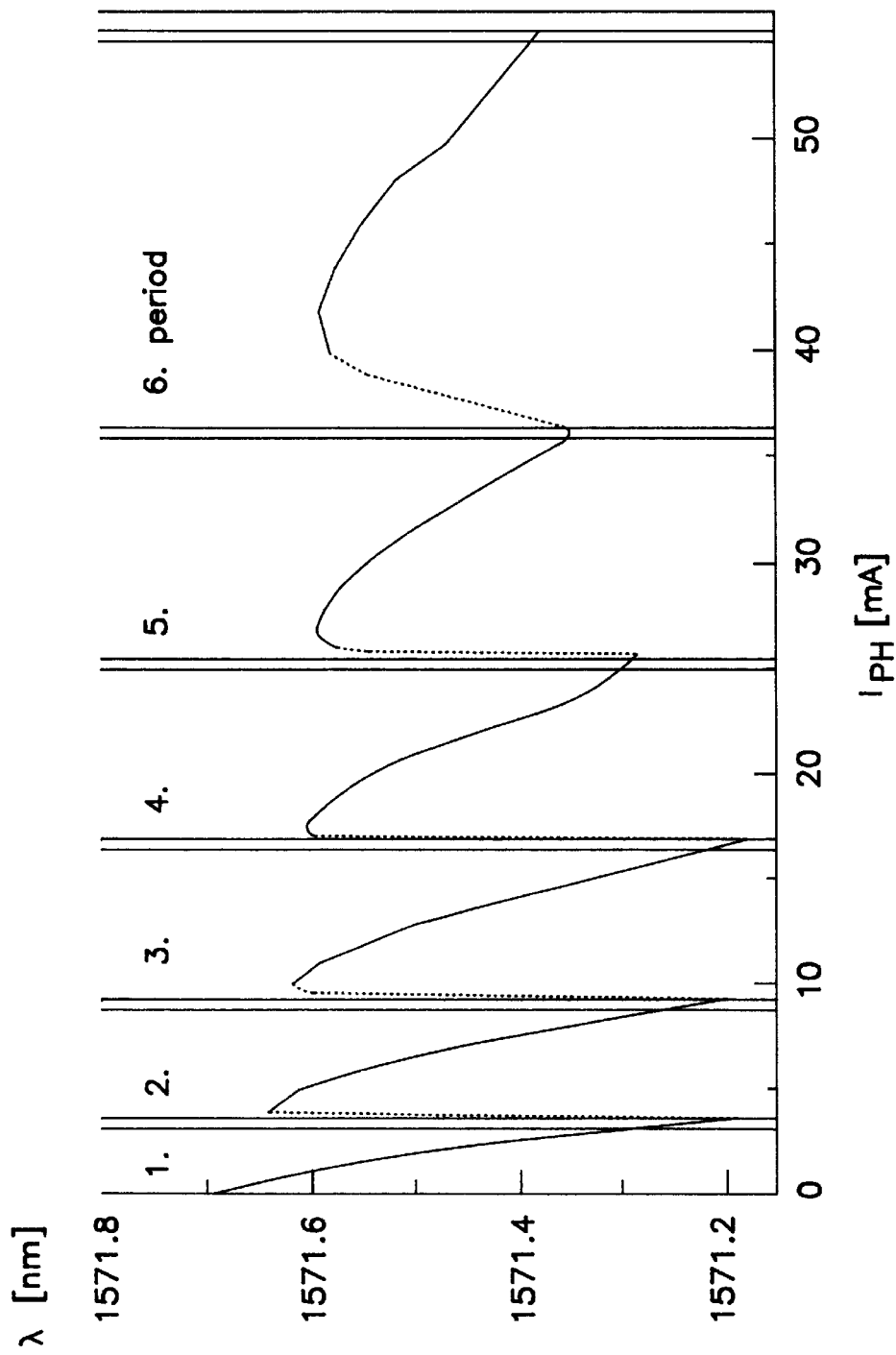
FIG. 4 are self-pulsation modes and tuning of wave length as a function of the phase current, in the multi-section laser shown in FIG. 1.

FIG. 4 depicts the switching effect in correlation with the wave length tuning by means of the phase current. The laser wave length λ displays a continuous blue shift with a following periodic step to about 0.5 nm larger wavelengths. The pulsation modes are marked by shading, and they occur with precisely the same periodicity as the phase current $I_{PH}$. Self-pulsation is always attained when the laser wavelength λ—provided the currents are properly adjusted—is tuned to the range shortly before the wavelength step. The switching function of the phase current as well as the close correlation with the spectral behavior are clearly recognizable here.

The further figures depict examples of arrangements of the control section between the two DFB sections $D_1$ and $D_2$. Integration of the multi-section laser into optical control circuits is made possible by these arrangements. In the figures, the corresponding cross-sections through the raised center strip of the fin waveguide structure are schematically shown.

Figure 5:
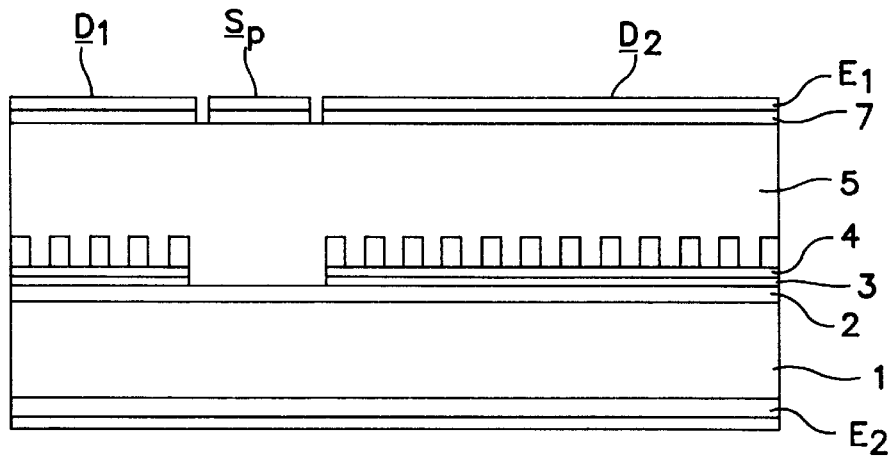
FIG. 5 is a cross-section through a multi-section laser provided with a passive control section arranged between two DFB sections.
Figure 6:
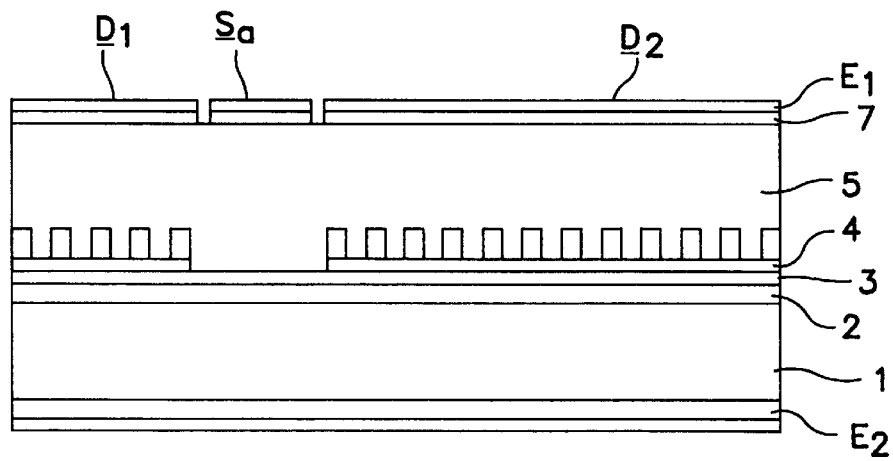
FIG. 6 is a cross-section of a multi-section laser provided with an active control section arranged between two DFB sections.
Figure 7:
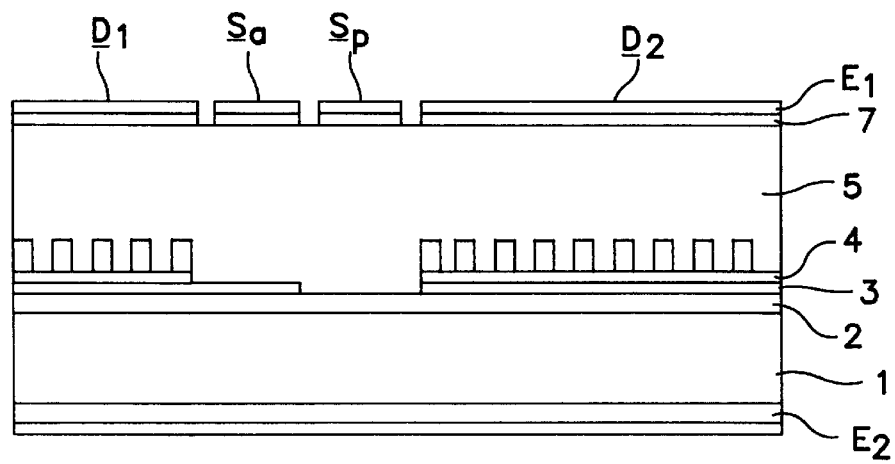
FIG. 7 is a cross-section of a multi-section laser provided with an active as well as a passive control section arranged between two DFB sections.

Thus, in FIG. 5 the passive control section $S_p$ is arranged between the two DFB sections $D_1$ and $D_2$. In this case, the refractive index of the control section $S_p$ is variable by the current applied to this section. FIG. 6 depicts the arrangement between the two DFB sections $D_1$ and $D_2$ of a spacer formed as an active control section $S_a$ in an FP resonator. The active control section $S_a$ is provided with the same active layer 3 as the adjacent DFB sections $D_1$ and $D_2$. Attenuation or amplification of the light wave at only a weak refractive index by the current is made possible by the active layer 3. Changing the refractive index and amplification and attenuation is made possible by the combination of the two sections already mentioned, i.e. an active control section $S_a$ as well as a passive control section $S_p$ are arranged between the two DFB section $D_1$ and $D_2$.

The invention is not limited in its practice by the above-described preferred embodiments, since variations are conceivable which may make use of the present solution even in totally differently structured embodiments.

The self-pulsing two-section laser with an integrated control section may be used for optical beat regeneration in high-rate communication systems, because the self-pulsation may synchronize itself relative to optical signal currents by inherent effects, i.e. the periodic output signal may "latch" into the frequency and beat of an optically supplied data signal. The beat of the data signal may be recovered anywhere in the network. Switching the self-pulsation on and off, optimizing the self-pulsation and a selective variation of the wavelength of the laser mode are made possible for the first time by the integrated control section. Since the output efficiency of the multi-section laser in accordance with the invention is greater by several orders of magnitude than the pump output required for synchronizing the frequency, the self-pulsing two-section DFB laser with integrated control section may also be used for impulse amplification. On the basis of its described characteristics, its application as a frequency tunable impulse light source is also possible.

We claim:

1. A self-pulsing multi-section laser, comprising:

electrically energizable first and second distributive feedback (DFB) sections provided with DFB gratings; and a control section electrically energizable independently of and optically coupled to at least one of the first and second DFB sections and comprising a spacer and first and second reflectors to form a Fabry-Perot-like resonator for selectively generating a self-pulsing mode.

2. The self-pulsing multi-section laser according to claim 1, wherein said spacer comprises a passive control section.

3. The self-pulsing multi-section laser according to claim 2, wherein said passive control section is positioned intermediate one of said first and second distributed feedback sections and a facet limiting said multi-section laser.

4. The self-pulsing multi-section laser according to claim 2, wherein said passive control is positioned intermediate said first and second distributed feedback sections.

5. The self-pulsing multi-section laser according to claim 1, wherein said spacer comprises an active control section.

6. The self-pulsing multi-section laser according to claim 5, wherein said spacer is positioned intermediate said first and second distributed feedback sections.

7. The self-pulsing multi-section laser according to claim 6, wherein said first and second distributed feedback sections and said spacer comprise substantially identical active layers.

8. The self-pulsing multi-section laser according to claim 1, wherein said spacer means comprises separately electrically energizable active and passive control sections positioned intermediate said first and second distributed feedback sections.

9. The self-pulsing multi-section laser according to claim 1, wherein the gratings of the first and second distributed feedback sections are detuned in the Bragg wavelength with respect to each other.

10. The self-pulsing multi-section laser according to claim 1, wherein said gratings of said first and second Distributed feedback sections have coupling coefficients of different values.

11. The self-pulsing multi-section laser according to claim 1, wherein said multi-section laser comprises a fin wave guide structure having an elevated center strip and comprising a plurality of layers, including, from bottom to top: a base electrode layer; an n-InP substrate; an n-1.3 μm-InGaAsP waveguide layer; a 1.55 μm-InGaAsP active layer; a p-1.18 μm-InGaAsP waveguide layer; a p-InP layer; an $SiN_x$ layer open only at the fin; and an electrode layer.

12. The self-pulsing multi-section laser according to claim 11, further comprising a p-InGaAs layer at said center strip for reducing contact resistance.

13. The self-pulsing multi-section laser according to claim 12, wherein said n-1.3 μm-InGaAsP waveguide layer has a thickness of 300 nm, said p-1.18 μm-InGaAsP waveguide layer has a thickness of 150 nm, said 1.55 μm-InGaAsP active layer has a thickness of 150 nm and said p-InGaAs layer on said center strip has a thickness of 400 nm.

14. The self-pulsing multi-section laser according to claim 13, wherein said first and second distributed feedback sections each have a length of 200 μm and said spacer has a length of 400 μm.

15. The self-pulsing multi-section laser according to claim 11, wherein said gratings are inscribed by electron beam lithography and etched into said p-1.18 μm-InGaAsP waveguide layer.

* * * * *